United States Patent
Nagai et al.

(10) Patent No.: US 6,642,142 B2
(45) Date of Patent: Nov. 4, 2003

(54) SUBSTRATE CLEANING METHOD AND METHOD FOR PRODUCING AN ELECTRONIC DEVICE

(75) Inventors: Toshihiko Nagai, Takatsuki (JP); Hiroshi Tanaka, Sanda (JP); Naoki Yokoi, Osaka (JP); Yasuhiro Asaoka, Itami (JP); Seiji Muranaka, Itami (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/034,371

(22) Filed: Jan. 3, 2002

(65) Prior Publication Data

US 2002/0197853 A1 Dec. 26, 2002

(30) Foreign Application Priority Data

May 7, 2001 (JP) ........................................ 2001-135918

(51) Int. Cl.$^7$ ......................................... H01L 21/4763
(52) U.S. Cl. ..................... 438/637; 438/790; 134/31; 134/33
(58) Field of Search ................. 438/637, 903, 438/790; 134/31, 33, 32, 198, 199

(56) References Cited

U.S. PATENT DOCUMENTS

| 5,727,332 | A | * | 3/1998 | Thrasher et al. | 34/277 |
|---|---|---|---|---|---|
| 5,778,554 | A | * | 7/1998 | Jones | 34/58 |
| 5,882,433 | A | * | 3/1999 | Ueno | 134/31 |
| 5,932,027 | A | * | 8/1999 | Mohindra et al. | 134/2 |
| 6,004,399 | A | * | 12/1999 | Wong et al. | 134/2 |
| 6,024,107 | A | * | 2/2000 | Jones | 134/104.1 |
| 6,045,621 | A | * | 4/2000 | Puri et al. | 134/10 |
| 6,122,837 | A | * | 9/2000 | Olesen et al. | 34/315 |
| 6,158,446 | A | * | 12/2000 | Mohindra et al. | 134/2 |
| 6,213,136 | B1 | * | 4/2001 | Jones | 134/102.3 |
| 6,346,505 | B1 | * | 2/2002 | Morita et al. | 134/1 |

FOREIGN PATENT DOCUMENTS

| JP | 07-201794 | 8/1995 |
|---|---|---|
| JP | 10-55993 | 2/1998 |

* cited by examiner

Primary Examiner—John F. Niebling
Assistant Examiner—Olivia Luk
(74) Attorney, Agent, or Firm—Nixon & Peabody LLP; Donald R. Studebaker

(57) ABSTRACT

In a water rinsing process performed after the surface of a substrate has been cleaned using a cleaning solution, a first spinning process, in which water is supplied to the surface of the substrate while the substrate is rotated at a first rotation speed, and a second spinning process, in which the substrate is rotated at a second rotation speed that is higher than the first rotation speed, are repeatedly performed alternately.

15 Claims, 12 Drawing Sheets

Low-speed rotation

High-speed rotation

SUBSTRATE CLEANING METHOD AND METHOD FOR PRODUCING AN ELECTRONIC DEVICE

BACKGROUND OF THE INVENTION

The present invention relates to a substrate cleaning method and method for producing an electronic device that uses this cleaning method. In particular, the present invention relates to a method in which the formation of a recess by performing dry-etching for an insulating film is followed by the removal of residue from the side walls or bottom of the recess using a cleaning solution and then by a short, efficient rinsing of the recess with water.

When producing electronic devices, dry etching techniques are commonly used to pattern an insulating film or conductive film, for example. When doing so, a known problem is that residue (such as side wall protection film and remaining polymer) that is caused by an etching gas, a photoresist or a processed film is often left around the etched pattern (such as the via holes and wires), formed by the dry etching. If such residue is left in the via holes, for example, problems can result, such as poor connections between the upper and lower wiring layers and increased resistance of the via holes. Also, if residue is present on the side walls of wiring, for example, this can cause short circuits between adjacent wires. In this way, the presence of such residue can drastically reduce the reliability of an electronic device.

In order to remove such residue, it is now common practice to use a cleaning solution that includes various organic or inorganic compounds. Also, in the cleaning process that uses this kind of cleaning solution, or in the rinsing process with water that follows the cleaning process, the cleaning or rinsing can be made more thorough by using a single-wafer-processing-type or batch-processing-type spin cleaner.

FIG. 6 shows how the surface of a processed substrate (a substrate to be processed is also referred to as "processed substrate" in this specification) composed of a semiconductor wafer is rinsed with water using a single-wafer-processing-type spin cleaner.

As shown in FIG. 6, a single-wafer-processing-type spin cleaner supports a single processed substrate 60 with a spin chuck (not shown) that is fixed to the rotation shaft of a motor 61. While the motor 61 is rotating the processed substrate 60, the nozzle 62 expels water 63 onto the processed substrate 60 so as to rinse the surface of the processed substrate 60 with water.

FIG. 7 shows how the surfaces of processed substrates composed of semiconductor wafers are rinsed with water using a batch-processing-type spin cleaner.

As shown in FIG. 7, a batch-processing-type spin cleaner supports a plurality of processed substrates 70 with a rotor 72 that is fixed to the rotation shaft of a motor 71. While the motor 71 is rotating the processed substrates 70, the nozzles 73 expel water 74 onto the processed substrates 70 so as to rinse the surfaces of the processed substrates 70 with water.

In recent years, the scale down and improved packing ratio of electronic devices has led to a reduction in the dimensions of etching patterns, such as in the diameter of the via holes. As a result, when a cleaning process that uses a cleaning solution is followed by a water rinsing process, there is a reduction in the efficiency with which the cleaning solution is replaced with water in the via holes, especially near the bottoms of the via holes. This occurs even when a spin cleaner is used. Near the bottoms of the via holes, there is a decrease in the speed of dispersion of the cleaning solution, so that more time is required to perform the water rinsing process. Depending on the type of cleaning solution used, cleaning solution that has been diluted with water can cause corrosion of the conductive film or the like. This means that as the water rinsing process becomes longer, there is a concurrent increase in the length of time the areas around the bottoms of the via holes provided on top of the wiring, for example, are exposed to diluted cleaning solution. This can cause corrosion of the wiring and a fall in the reliability of electronic devices produced in this way.

SUMMARY OF THE INVENTION

In view of the above, it is an object of the present invention to shorten the time required by a water rinsing process, which is performed after a processed substrate has been cleaned using a cleaning solution, by raising the efficiency with which the cleaning solution is replaced with water.

In order to achieve the above object, as a comparative example, the inventors first tried rinsing via holes formed in an insulating film on a substrate with water using a spin cleaner after using a cleaning solution to remove residue from the side walls and other parts of the via holes. Note that in this comparative example, a cleaning solution formed by adding a fluorine compound, which is capable of etching the insulating film, to an organic solvent is used as the cleaning solution for removing residue. Hereafter, such cleaning solution is referred to as a "fluorine-containing cleaning solution". As examples, the fluorine-containing cleaning solutions disclosed in Japanese Laid-Open Patent Applications H07-201794 and H10-55993 were used. When using such a fluorine-containing cleaning solution, there is no risk of the insulating film being excessively etched, which would result in the via holes being badly deformed. However, when a fluorine-containing cleaning solution is diluted with water, the fluorine compound in the cleaning solution ends up having an etching effect for the conductive film, resulting in corrosion of the conductive film. FIG. 8 shows one example of the relationship between the dilution factor of the fluorine-containing cleaning solution and the etching rate of the conductive film by the fluorine-containing cleaning solution. As shown in FIG. 8, the fluorine-containing cleaning solution exerts a strong etching effect for the conductive film when the dilution factor with water is within in a specified range.

FIGS. 9A to 9C are cross-sectional diagrams showing the processes in a method for producing an electronic device according to this comparative example.

First, as shown in FIG. 9A, wiring 84 that is composed of a laminated structure of a first titanium nitride film 81, an aluminum alloy film 82, and a second titanium nitride film 83 is formed on a substrate 80 composed of a semiconductor wafer. After this, an insulating film 85 is formed on top of the wiring 84. Next, a resist film is formed on the insulating film 85, and the resist film is exposed to light in a desired pattern using a conventional projection method. By developing the resist film that have been exposed using a conventional developing process, a resist pattern 86 is formed with openings at areas where via holes are to be formed.

Next, dry etching is successively performed for the insulating film 85 and the second titanium nitride film 83 with the resist pattern 86 as a mask. As shown in FIG. 9B, once via holes 87 have been formed, plasma ashing is performed to remove the resist pattern 86. When doing so, residue 88 ends up on the side walls and in the bottom of the via holes 87.

As shown in FIG. 9C, a single-wafer-processing-type or batch-processing-type spin cleaner (not shown) is used to remove the residue 88. This apparatus supplies a fluorine-containing cleaning solution at 23° C. for 5 to 10 minutes to the surface of the substrate 80 while rotating the substrate 80 at a predetermined rotation speed in a range (called the "low rotation region") of 10 to 200 rpm (revolution per minute), for example. The same spin cleaner is then used to rotate the substrate 80 at a predetermined rotation speed in the low rotation region while rinsing the surface of the substrate 80 including the via holes 87 with water. The substrate 80 is then dried. If the openings of the via holes 87 are small, during the water rinsing process that follows the cleaning process that uses the fluorine-containing cleaning solution, there is a drop in the efficiency with which the fluorine-containing cleaning solution is replaced with water inside the via holes 87, especially near the bottoms of the via holes 87. This means that the water rinsing process ends up taking longer to perform. Since there is an increase in the amount of time fluorine-containing cleaning solution that has been diluted with water is present near the bottoms of the via holes 87, there is pronounced corrosion of the aluminum alloy film 82 forming the wiring 84 at the bottoms of the via holes 87, as shown in FIG. 9C. This corrosion forms holes 89 under a portion of the insulating film 85 near the via holes 87.

In order to evaluate the reliability of the wiring 84 of an electronic device that has been produced using the method shown in FIGS. 9A to 9C, the inventors of the present invention performed high-temperature storage tests on the wiring 84 using a temperature of 200° C. and a period of 1,000 hours. The rate of increase in resistance for the wiring 84 during this high-temperature storage test (hereafter, this is referred to as the "high-temperature storage resistance increase rate") was found to be very high at around 20 to 30%. This large increase in the resistance of the wiring 84 was found to be even across the substrate 80, that is to say, across the entire semiconductor wafer.

With reference to the comparative example described above, the inventors of the present invention examined causes that reduce the efficiency with which the cleaning solution is replaced with water in the via holes, especially near the bottoms of the via holes in a water rinsing process after a cleaning process using a cleaning solution, when the hole size of the via holes is small. Then, the inventors of the present invention found that the conventional water rinsing method using a spin cleaner, that is, the water rinsing method where the rotation speed of the processed substrate (hereinafter, referred to as "substrate rotation speed") is fixed to a constant speed causes a reduction in the efficiency with which the cleaning solution is replaced with water near the bottoms of the via holes.

FIG. 10 shows, during the water rinsing process that follows the cleaning of a processed substrate in which via holes have been formed using a cleaning solution, the state of the water around a via hole when water is supplied to the surface of a processed substrate while the substrate is being rotated at a substrate rotation speed in a low rotation region.

As shown in FIG. 10, when the substrate is rotated at a predetermined substrate rotation speed in a low rotation region, the water which has been supplied to the processed substrate forms a high-speed turbulent flow at some distance from the surface of the substrate. On the other hand, there is a low-speed laminar flow of water close to the surface of the processed substrate. As a result, a region of vortex flow with a high speed of dispersion is formed only at the upper portion of the via holes. On the other hand, a region of convectional flow with a low speed of dispersion is formed largely at the lower portion of the via holes. If this state is maintained, which is to say, if the rinsing with water is performed with the substrate rotation speed fixed at a predetermined speed in the low rotation region, the exchange of cleaning solution with water is promoted at the upper portion of the via holes, but is sluggish near the bottoms of the via holes. This means that a long time is required to perform the water rinsing process. During this process, the metal film forming the wiring at the bottoms of the via holes is exposed to cleaning solution that has been diluted with water for a prolonged period, so that the metal film forming the wiring suffers from corrosion.

For the above reason, the inventors of the present invention changed the speed of rotation of the substrate during the water rinsing process following the cleaning process that uses the cleaning solution. In more detail, the inventors conceived a method where rinsing that uses a substrate rotation speed in a low rotation region and rinsing that uses a substrate rotation speed in a high rotation region (that is, a higher substrate rotation speed than the substrate rotation speed in the low rotation region) are repeatedly performed alternately. By using this method, cleaning solution (including cleaning solution that has been diluted with water) that remains on the surface of the substrate is subjected to centrifugal forces so as to improve the efficiency with which cleaning solution is replaced with water in the via holes, especially near the bottoms of the via holes. By doing so, the time required by the water rinsing process can be reduced.

FIG. 11A is a representation of the rinsing of the surface of a processed substrate with water while the processed substrate is being rotated at a substrate rotation speed in a low rotation region using the single-wafer-processing-type spin cleaner shown in FIG. 6. FIG. 11B is a representation of the rinsing of the surface of a processed substrate with water while the processed substrate is being rotated at a substrate rotation speed in a high rotation region using the single-wafer-processing-type spin cleaner shown in FIG. 6. It should be noted that in FIGS. 11A and 11B, the components that are the same as the single-wafer-processing-type spin cleaner shown in FIG. 6 have been given the same reference numerals and are not described further.

FIG. 12A is a representation of the rinsing of the surfaces of processed substrates with water while the processed substrates are being rotated at a substrate rotation speed in a low rotation region using the batch-processing-type spin cleaner shown in FIG. 7. FIG. 12B is a representation of the rinsing of the surfaces of processed substrates with water while the processed substrates are being rotated at a substrate rotation speed in a high rotation region using the batch-processing-type spin cleaner shown in FIG. 7. It should be noted that in FIGS. 12A and 12B, the components that are the same as the batch-processing-type spin cleaner shown in FIG. 7 have been given the same reference numerals and are not described further.

As shown in FIGS. 11B and 12B, using a substrate rotation speed in the high rotation region increases the amount of cleaning solution (including cleaning solution that has been diluted with water) dispelled from the processed substrate or substrates. If this use of a substrate rotation speed in the high rotation region is followed by a repeated supplying of water to the surface of the processed substrate or substrates again with the substrate or substrates being rotated at a substrate rotation speed in the low rotation region, the efficiency with which cleaning solution is replaced with water is improved, even near the bottoms of the via holes.

However, the inventors of the present invention found that by not supplying water to the surface of the processed substrate while the substrate is being rotated at a substrate rotation speed in the high rotation region and immediately afterwards supplying water to the surface of the processed substrate while the substrate is being rotated at a substrate rotation speed in the low rotation region, a further improvement can be made to the efficiency with which cleaning solution is replaced with water near the bottoms of the via holes.

FIG. 13A shows the state of the water around one of the via holes during a process where the processed substrate, in which the via holes have been formed, is rotated at a substrate rotation speed in a high rotation region without water being supplied to the surface of the processed substrate, the process following the spinning process shown in FIG. 10 that uses a substrate rotation speed in the low rotation region. FIG. 13B shows the state of the cleaning solution around one of the via holes when, immediately after the spinning process shown in FIG. 13A that uses a substrate rotation speed in the high rotation region, water is supplied to the surface of the processed substrate, in which the via holes have been formed, while the processed substrate is rotated at a substrate rotation speed in the low rotation region.

As shown in FIG. 13A, if a substrate rotation speed in the high rotation region is used without water being supplied, the resulting centrifugal forces dispel water, thereby reducing the amount of water present on the substrate. This remedies the problem of the presence of a laminar flow of water on the surface of the processed substrate in the process shown in FIG. 10.

Also, as shown in FIG. 13B, if the supplying of water is recommenced while a substrate rotation speed in the low rotation region is being used immediately after a substrate rotation speed in the high rotation region has been used, there is no laminar flow of water on the surface of the processed substrate, or in other words, there is only a turbulent flow of water on the surface of the processed substrate. This results in a large region of vortex flow with a high speed of dispersion being formed within the via holes. This improves the efficiency with which cleaning solution is replaced with water throughout the insides of the via holes, so that the efficiency with which cleaning solution is replaced with water near the bottoms of the via holes is also improved, thereby achieving a considerable reduction in the time required by the water rinsing process. Consequently, the corrosion of the metal film forming the wiring at the bottoms of the via holes by cleaning solution that has been diluted with water is reliably suppressed.

The present invention is based on the above knowledge. In more detail, a first substrate cleaning method according to the present invention comprises steps of cleaning a surface of a processed substrate using a cleaning solution, and rinsing the surface of the processed substrate with water after the processed substrate has been cleaned, wherein the step of rinsing the surface of the processed substrate includes a step of having a first spinning process, where the processed substrate is rotated at a first rotation speed and water is simultaneously supplied to the surface of the processed substrate, and a second spinning process, where the processed substrate is rotated at a second rotation speed that is higher than the first rotation speed and water is simultaneously supplied to the surface of the processed substrate, repeatedly performed alternately by the same spin cleaner.

With the first substrate cleaning method given above, the step of rinsing with water that follows the step of cleaning the surface of the processed substrate with a cleaning solution has a first spinning process, where the processed substrate is rotated at a first rotation speed and water is simultaneously supplied to the surface of the processed substrate, and a second spinning process, where the processed substrate is rotated at a second rotation speed that is higher than the first rotation speed, repeatedly performed alternately. As a result, centrifugal forces generated during the second spinning process act to dispel cleaning solution (including cleaning solution that has been diluted with water), thereby increasing the efficiency with which cleaning solution is replaced with water on the surface of the processed substrate and consequently reducing the time required by the step of rinsing with water. When a conductive pattern is formed on the processed substrate, this reduction in time suppresses the corrosion of the conductive pattern by cleaning solution that has been diluted with water, thereby raising the reliability of electronic devices.

With this first substrate cleaning method, water is continuously supplied to the surface of the substrate in the first spinning process and the second spinning process, thereby facilitating the execution of the step of rinsing with water.

A second substrate cleaning method according to the present invention comprises steps of cleaning a surface of a processed substrate using a cleaning solution, and rinsing the surface of the processed substrate with water after the processed substrate has been cleaned, wherein the step of rinsing the surface of the processed substrate includes a step of having a first spinning process, where the processed substrate is rotated at a first rotation speed and water is simultaneously supplied to the surface of the processed substrate, and a second spinning process, where the processed substrate is rotated at a second rotation speed that is higher than the first rotation speed without water being supplied to the surface of the processed substrate, repeatedly performed alternately by the same spin cleaner.

With the second substrate cleaning method given above, the step of rinsing with water that follows the step of cleaning the surface of the processed substrate with a cleaning solution has a first spinning process, where the processed substrate is rotated at a first rotation speed and water is simultaneously supplied to the surface of the processed substrate, and a second spinning process, where the processed substrate is rotated at a second rotation speed that is higher than the first rotation speed, repeatedly performed alternately. As a result, centrifugal forces generated during the second spinning process act to dispel cleaning solution (including cleaning solution that has been diluted with water), thereby increasing the efficiency with which cleaning solution is replaced with water on the surface of the processed substrate and consequently reducing the time required by the step of rinsing with water. When a conductive pattern, such as wiring, is formed on the processed substrate, this reduction in time suppresses the corrosion of the conductive pattern by cleaning solution that has been diluted with water, thereby raising the reliability of electronic devices.

Also, with this second substrate cleaning method, the supply of water to the surface of the processed substrate is stopped during the second spinning step that uses the second rotation speed that is higher than the first rotation speed. As a result, compared to the case where water is supplied to the surface of the substrate during the second spinning step, there is an improvement in the efficiency with which water is replaced with cleaning solution on the surface of the processed substrate. This means that even less time is required by the step of rinsing with water. Also, during the second spinning process, centrifugal forces do not result in water flowing at high speed across the periphery of the substrate, which suppresses any deviation in the efficiency with which the cleaning solution is replaced with water between the center and the periphery of the processed substrate. This means that the surface of the processed substrate can be evenly rinsed with water. As a result, when wiring, for example, is provided on the processed substrate, the corrosion of the wiring is suppressed evenly across the surface of the processed substrate, so that the wiring can be formed with favorable characteristics across the entire surface of the processed substrate.

In the first and second substrate cleaning methods, the spin cleaner may be a batch-processing-type spin cleaner or a single-wafer-processing-type spin cleaner.

In the first and second substrate cleaning methods, it is preferable that the first rotation speed is between 10 and 200 rpm.

As a result, water can be evenly supplied to the surface of the processed substrate in the first spinning process, so that the surface of the processed substrate can be evenly rinsed with water.

In the first and second substrate cleaning methods, it is preferable that the second rotation speed is between 400 and 2000 rpm.

With this, in the second spinning step, cleaning solution (including cleaning solution that has been diluted with water) is reliably dispelled, so that there is a definite improvement in the efficiency with which the cleaning solution is replaced with water on the surface of the processed substrate.

In the first and second substrate cleaning methods, it is preferable that the acceleration at which the rotation speed of the processed substrate increases from the first rotation speed to the second rotation speed and the deceleration at which the rotation speed of the processed substrate decreases from the second rotation speed to the first rotation speed are between 100 and 400 rpm per second.

By doing so, the load of the spin cleaner can be reduced while changing the rotation speed at which the processed substrate is rotated.

In the second substrate cleaning method, it is preferable that the acceleration at which the rotation speed of the processed substrate increases from the first rotation speed to the second rotation speed and the deceleration at which the rotation speed of the processed substrate decreases from the second rotation speed to the first rotation speed are between 600 and 1000 rpm per second.

As a result, high acceleration and deceleration are achieved between the first and second spinning processes, so that there is a further increase in inertia that increases the action that dispels the cleaning solution (including cleaning solution that has been diluted with water). Consequently, there is a further improvement in the efficiency with which the cleaning solution is replaced with water on the surface of the processed substrate.

A first method for producing an electronic device according the present invention comprises steps of forming an insulating film on a conductive pattern formed on a substrate, performing dry-etching for the insulating film with a resist pattern as a mask to form a recess in the insulating film, removing residue from at least one of side and bottom surfaces of the recess using a cleaning solution, and rinsing the recess, from which residue has been removed, with water, wherein the step of rinsing the recess with water includes a step of having a first spinning process, where the processed substrate is rotated at a first rotation speed and water is simultaneously supplied to the surface of the processed substrate, and a second spinning process, where the processed substrate is rotated at a second rotation speed that is higher than the first rotation speed and water is simultaneously supplied to the surface of the processed substrate, repeatedly performed alternately by a same spin cleaner.

With the first method for producing an electronic device given above, the step of rinsing with water that follows the step of cleaning the recess formed above the conductive pattern on the substrate with a cleaning solution has a first spinning process, where the processed substrate is rotated at a first rotation speed and water is simultaneously supplied to the surface of the processed substrate, and a second spinning process, where the processed substrate is rotated at a second rotation speed that is higher than the first rotation speed, repeatedly performed alternately. As a result, centrifugal forces generated during the second spinning process act to dispel cleaning solution (including cleaning solution that has been diluted with water), thereby increasing the efficiency with which cleaning solution is replaced with water in the insides of the recess, especially near the bottom of the recess. This reduces the time required by the step of rinsing with water and suppresses the corrosion, by cleaning solution that has been diluted with water, of a conductive pattern at the bottom of the recess, for example, a lower wiring layer below via holes. As a result, the reliability of electronic devices is raised.

Also, with the first method for producing an electronic device given above, water is continuously supplied to the surface of the substrate in the first spinning process and the second spinning process, thereby facilitating the execution of the step of rinsing with water.

A second method for producing an electronic device according the present invention comprises steps of forming an insulating film on a conductive pattern formed on a substrate, performing dry-etching for the insulating film with a resist pattern as a mask to form a recess in the insulating film, removing residue from at least one of side and bottom surfaces of the recess using a cleaning solution, and rinsing the recess, from which residue has been removed, with water, wherein the step of rinsing the recess with water includes a step of having a first spinning process, where the processed substrate is rotated at a first rotation speed and water is simultaneously supplied to the surface of the processed substrate, and a second spinning process, where the processed substrate is rotated at a second rotation speed that is higher than the first rotation speed without water being supplied to the surface of the processed substrate, repeatedly performed alternately by the same spin cleaner.

With the second method for producing an electronic device given above, the step of rinsing with water that follows the step of cleaning the recess formed above the conductive pattern on the substrate with a cleaning solution has a first spinning process, where the processed substrate is rotated at a first rotation speed and water is simultaneously supplied to the surface of the processed substrate, and a second spinning process, where the processed substrate is rotated at a second rotation speed that is higher than the first rotation speed, repeatedly performed alternately. As a result, centrifugal forces generated during the second spinning process act to dispel cleaning solution (including cleaning solution that has been diluted with water), thereby increasing the efficiency with which cleaning solution is replaced with water in the insides of the recess, especially near the bottom of the recess. This reduces the time required by the step of rinsing with water and suppresses the corrosion, by cleaning solution that has been diluted with water, of the conductive pattern at the bottom of the recess, for example, a lower wiring layer below via holes. As a result, the reliability of electronic devices is raised.

Also, with the second method for producing an electronic device, water is not supplied to the surface of the processed substrate during the second spinning step that uses the second rotation speed that is higher than the first rotation speed. As a result, compared to the case where water is supplied to the surface of the substrate during the second spinning step, there is an improvement in the efficiency with which water is replaced with cleaning solution near the bottom of the recess. This means that even less time is required by the step of rinsing with water. Also, during the second spinning process, centrifugal forces do not result in water flowing at high speed across the periphery of the substrate, which suppresses any deviation between the center and the periphery of the processed substrate in the efficiency with which the cleaning solution is replaced with water near the bottom of the recess. This means that the surface of the processed substrate can be evenly rinsed with water. As a result, the corrosion of a lower wiring layer or the like can be suppressed evenly across the surface of the processed substrate, so that a lower wiring layer or the like can be formed with favorable characteristics across the entire surface of the processed substrate.

In the first and the second methods for producing an electronic device, the spin cleaner may be a batch-processing-type spin cleaner or a single-wafer-processing-type spin cleaner.

In the first and second methods for producing an electronic device, it is preferable that the first rotation speed is between 10 and 200 rpm.

As a result, water can be evenly supplied to the surface of the processed substrate in the first spinning process, so that the surface of the processed substrate can be evenly rinsed with water.

In the first and second methods for producing an electronic device, it is preferable that the second rotation speed is between 400 and 2000 rpm.

As a result, in the second spinning step, cleaning solution (including cleaning solution that has been diluted with water) is reliably dispelled, so that there is a definite improvement in the efficiency with which the cleaning solution is replaced with water near the bottom of the recess.

In the first and second methods for producing an electronic device, it is preferable that the acceleration at which the rotation speed of the processed substrate increases from the first rotation speed to the second rotation speed and the deceleration at which the rotation speed of the processed substrate decreases from the second rotation speed to the first rotation speed are between 100 and 400 rpm per second.

By doing so, the load of the spin cleaner can be reduced while changing the rotation speed at which the processed substrate is rotated.

In the second method for producing an electronic device, it is preferable that the acceleration at which the rotation speed of the processed substrate increases from the first rotation speed to the second rotation speed and the deceleration at which the rotation speed of the processed substrate decreases from the second rotation speed to the first rotation speed are between 600 and 1000 rpm per second.

As a result, high acceleration and deceleration are achieved between the first and second spinning processes, so that there is a further increase in inertia that increases the action that dispels the cleaning solution (including cleaning solution that has been diluted with water). Consequently, there is a further improvement in the efficiency with which the cleaning solution is replaced with water near the bottom of the recess. As a result, the corrosion of a lower wiring layer or the like by cleaning solution that has been diluted with water can be definitely suppressed, so that a further improvement can be made in the reliability of electronic devices.

An electronic device according to the present invention is produced using the first or second substrate cleaning method according to the present invention or the first or second method for producing an electronic device according to the present invention.

During production, an electronic device according to the present invention is subjected to a step of rinsing with water that requires little time. When a conductive pattern, such as wiring, is formed on the substrate, corrosion of the conductive pattern by cleaning solution that has been diluted with water is suppressed, thereby improving the reliability of the electronic device.

BRIEF DESCRIPTION OF THE DRAWINGS

FIG. 11A is a representation of the rinsing of the surface of a processed substrate with water while the processed substrate is being rotated at a substrate rotation speed in a low rotation region using a single-wafer-processing-type spin cleaner, while

FIG. 12A is a representation of the rinsing of the surface of a processed substrate with water while the processed substrate is being rotated at a substrate rotation speed in a low rotation region using a batch-processing-type spin cleaner, while

DETAILED DESCRIPTION OF THE INVENTION

First Embodiment

Hereinafter, a method for producing an electronic device according to a first embodiment of the present invention will be described with reference to the accompanying drawings.

Figure 1A:
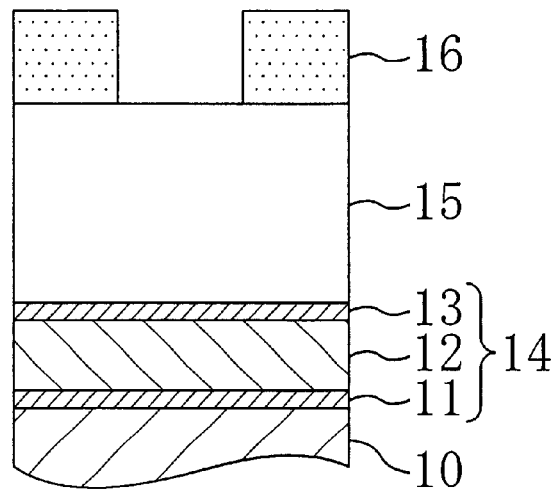
FIGS. 1A to 1C are cross-sectional diagrams showing the processes in a method for producing an electronic device according to a first embodiment of the present invention.
Figure 1B:
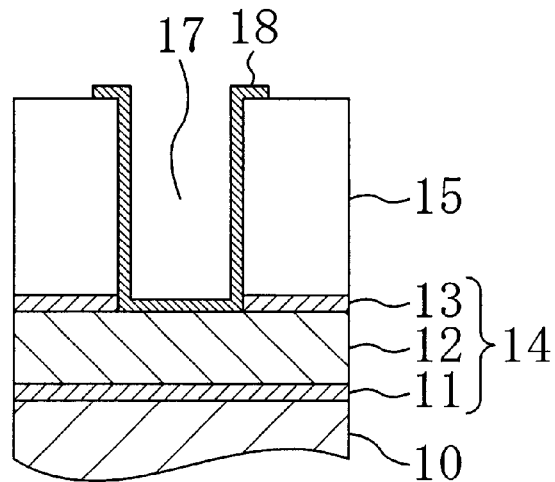
Figure 1C:
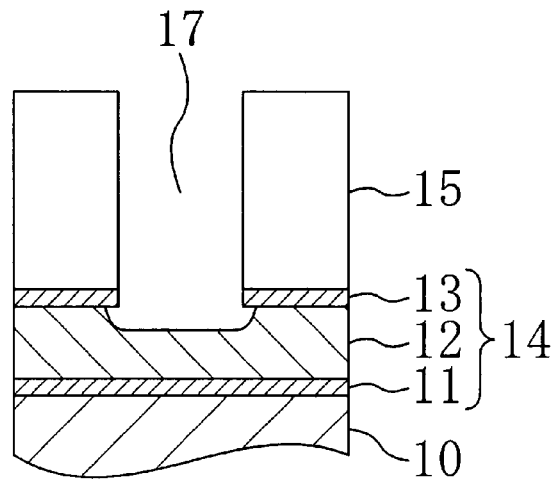

FIGS. 1A to 1C are cross-sectional drawings showing the various processes in the method for producing an electronic device according to this first embodiment.

First, as shown in FIG. 1A, wiring 14 that is composed of a laminated structure of a first titanium nitride film 11, an aluminum alloy film 12, and a second titanium nitride film 13 is formed on a substrate 10 composed of a semiconductor wafer. After this, an insulating film 15 is formed on top of the substrate 10, including the parts where the wiring 14 has been formed. Next, a resist film is formed on the insulating film 15, and the resist film is exposed to light in a desired pattern using a conventional projection method. By developing the resist film that have been exposed using a conventional developing process, a resist pattern 16 is formed with openings at areas where via holes are to be formed.

Next, dry etching is successively performed for the insulating film 15 and the second titanium nitride film 13 with the resist pattern 16 as a mask. As shown in FIG. 1B, once via holes 17 have been formed, plasma ashing is performed to remove the resist pattern 16. When doing so, residue 18 ends up on the side walls and in the bottom of the via holes 17.

As shown in FIG. 1C, a batch-processing-type spin cleaner (not shown) is used to remove the residue 18 by supplying, to the surface of the substrate 10 in which the via holes 17 have been formed, a cleaning solution capable of etching the insulating film 15. One example of the cleaning solution that can be used is a fluorine-containing cleaning solution that has the properties shown in FIG. 8 (see the "Summary of the Invention" section of this specification). By using a fluorine-containing cleaning solution, there is no risk of the insulating film 15 being excessively etched, which would result in the via holes 17 becoming badly deformed.

After this, the via holes 17 are rinsed with water using the same spin cleaner. In more detail, during the water rinsing of the via holes 17, a first spinning process and a second spinning process are repeatedly performed alternately. In the first spinning process, the substrate 10 is rotated at a constant speed (called the "first substrate rotation speed") that is within a low rotation region (for example, between 10 and 200 rpm) while water is supplied to the surface of the substrate 10 for between 3 and 30 seconds, for example. In the second spinning process, the substrate 10 is rotated at a constant speed (called the "second substrate rotation speed") that is within a high rotation region (for example, between 400 and 2000 rpm) while water is supplied to the surface of the substrate 10 for between 3 and 30 seconds, for example. After this, the substrate 10 is dried.

It should be noted that in this first embodiment, the acceleration that is performed for the substrate rotation speed from the first substrate rotation speed to the second substrate rotation speed, and the deceleration that is performed for the substrate rotation speed from the second substrate rotation speed to the first substrate rotation speed are both set in a range of 100 to 400 rpm per second.

Also, in this first embodiment, while the substrate rotation speed is changing between the first and second spinning processes, water is continuously supplied to the surface of the substrate 10.

Figure 9A:
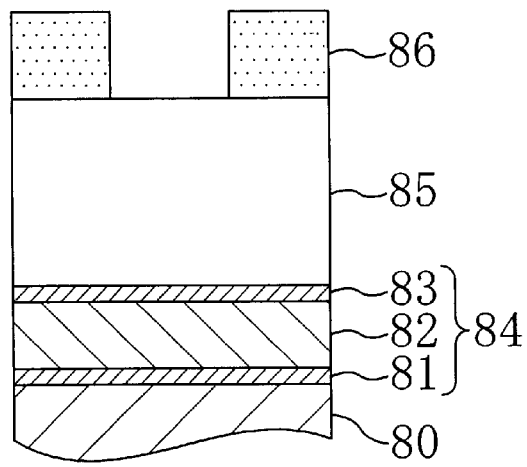
FIGS. 9A to 9C are cross-sectional diagrams showing the processes in a method for producing an electronic device according to a comparative example.
Figure 9B:
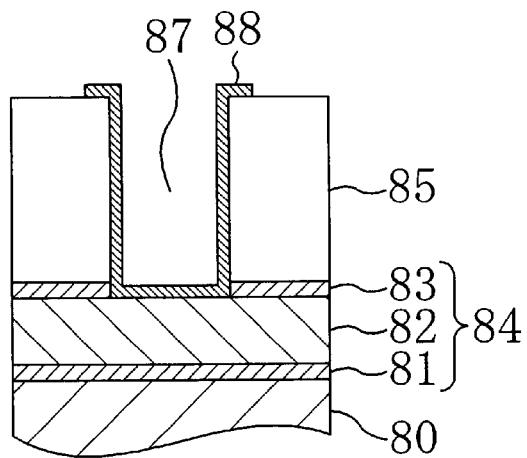
Figure 9C:
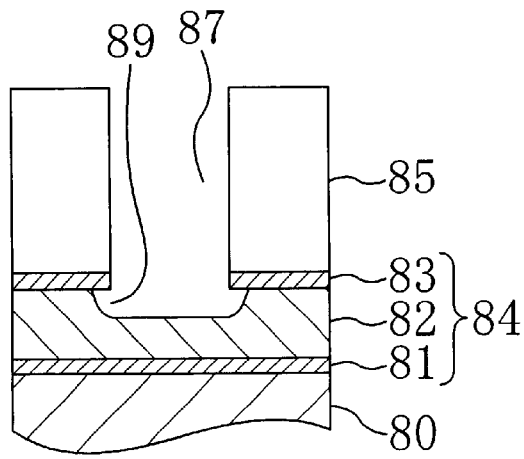
Figure 10:
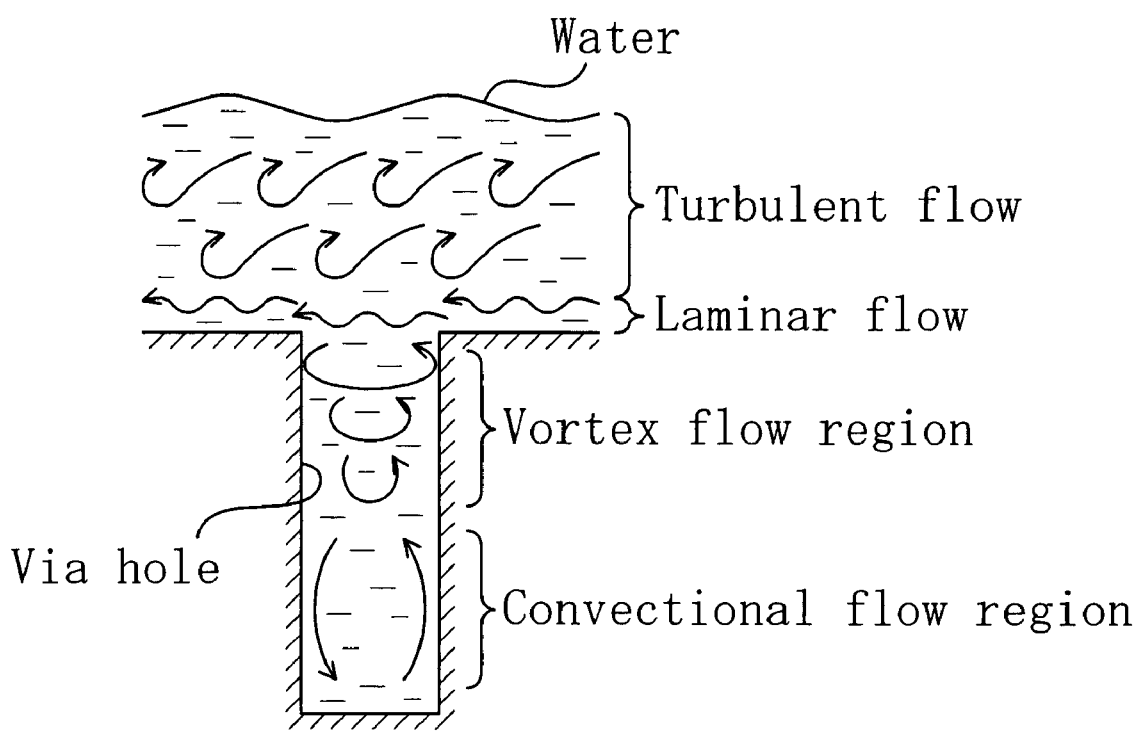
FIG. 10 shows, during a water rinsing process that follows the cleaning of a processed substrate in which via holes have been formed using a cleaning solution, the state of the water around a via hole when water is supplied to the surface of a processed substrate while the substrate is being rotated at a substrate rotation speed in a low rotation region.
Figure 11A:
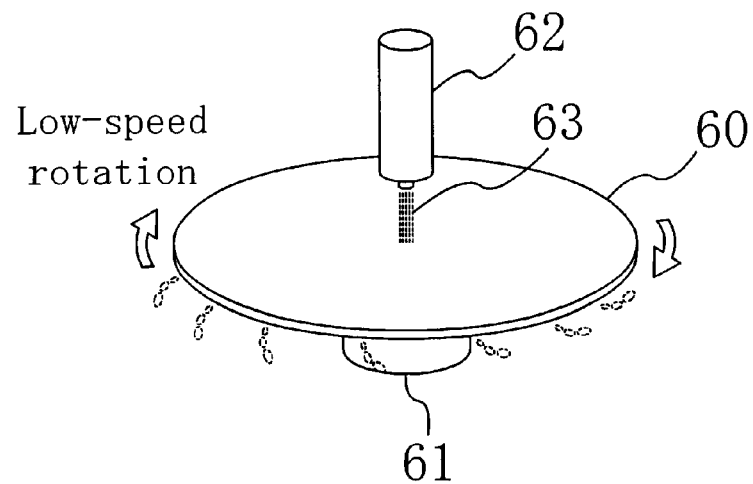
Figure 11B:
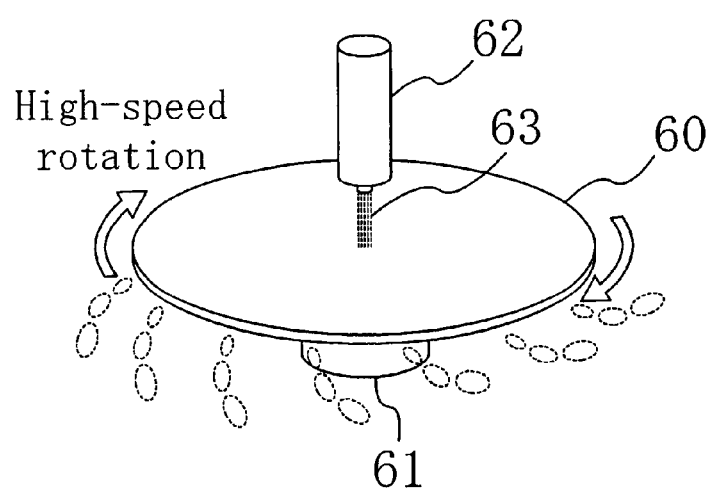
FIG. 11B is a representation of the rinsing of the surface of a processed substrate with water while the processed substrate is being rotated at a substrate rotation speed in a high rotation region using a single-wafer-processing-type spin cleaner.
Figure 12A:
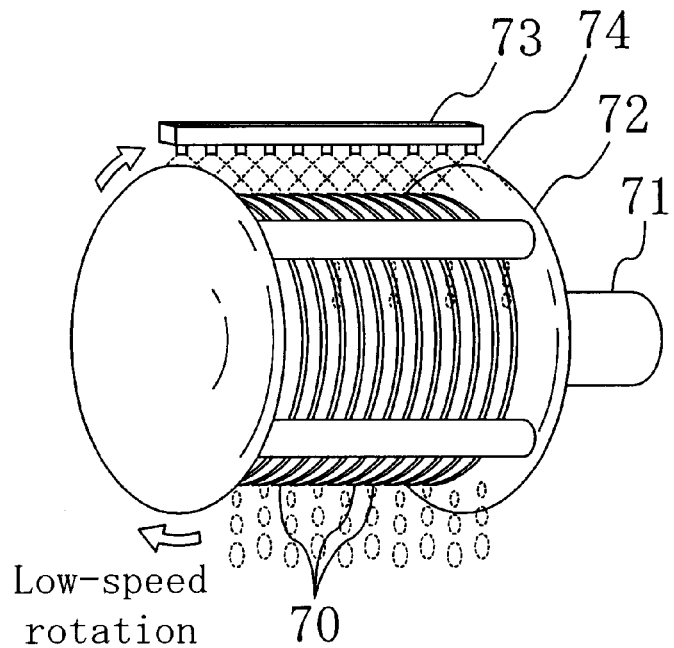
Figure 12B:
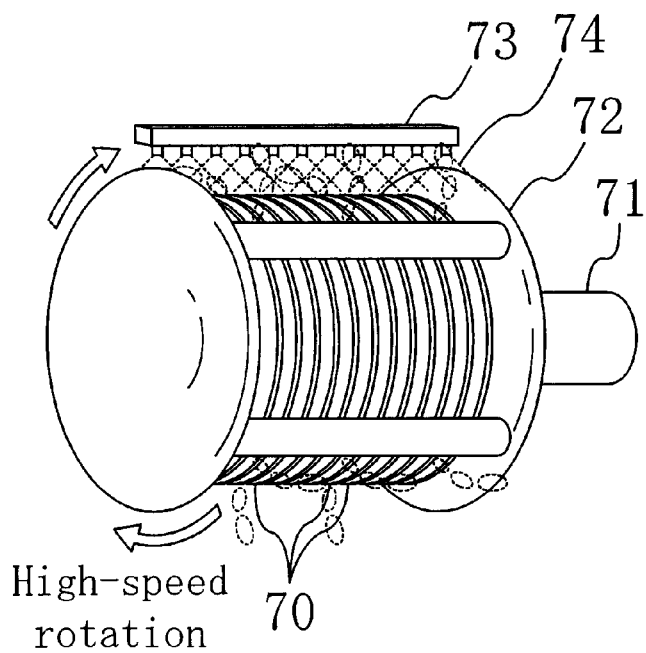
FIG. 12B is a representation of the rinsing of the surface of a processed substrate with water while the processed substrate is being rotated at a substrate rotation speed in a high rotation region using a batch-processing-type spin cleaner.
Figure 13A:
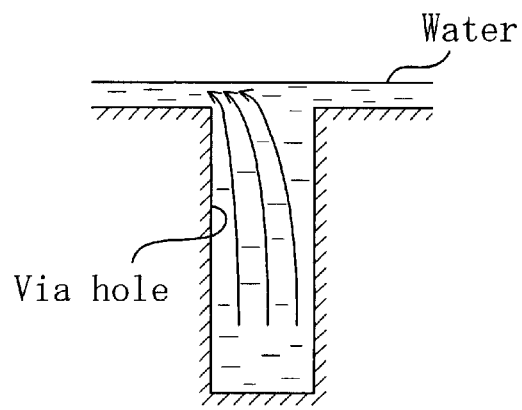
FIG. 13A shows the state of the water around one of the via holes during a process where the processed substrate, in which the via holes have been formed, is rotated at a substrate rotation speed in a high rotation region without water being supplied to the surface of the processed substrate, the process following the spinning process shown in FIG. 10 that uses a substrate rotation speed in the low rotation region.
Figure 13B:
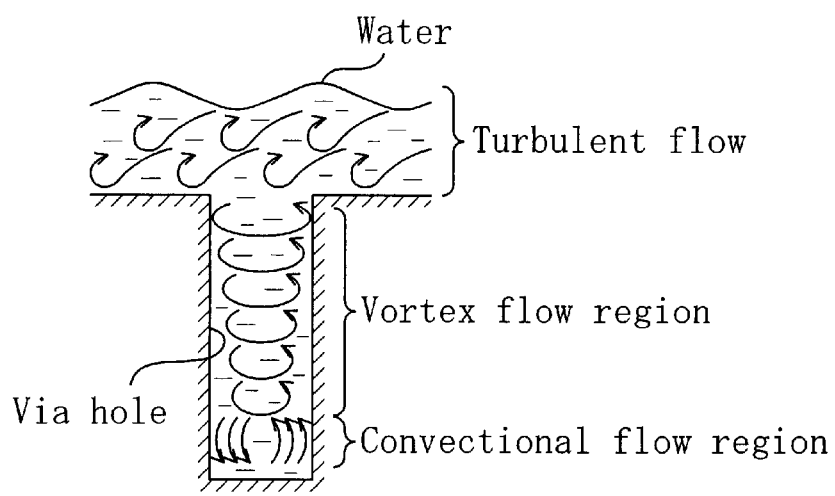
FIG. 13B shows the state of the cleaning solution around one of the via holes when, immediately after the spinning process shown in FIG. 13A that uses a substrate rotation speed in the high rotation region, water is supplied to the surface of the processed substrate, in which the via holes have been formed, while the processed substrate is rotated at a substrate rotation speed in the low rotation region.

When the inventors of the present invention investigated the cross-sectional form of the via holes 17 following the water rinsing, corrosion of the aluminum alloy film 12 forming the wiring 14 at the bottoms of the via holes 17 was suppressed, as can be understood by comparing FIG. 1C with the comparative example (see FIG. 9C). Also, only small holes were identified under a portion of the insulating film 15 near the via holes 17. In other words, when compared to the comparative example, the efficiency with which cleaning solution is replaced with water near the bottoms of the via holes 17 is improved. However, for the reasons given later, the holes produced due to corrosion of the conductive layer in the wiring are a certain degree larger in the center of the substrate 10 than at the periphery.

In order to evaluate the reliability of the wiring 14 of an electronic device that has been produced using the method shown in FIGS. 1A to 1C, the inventors of the present invention performed high-temperature storage tests on the wiring 14 using a temperature of 200° C. and a period of 1,000 hours. The high-temperature storage resistance increase rate for the wiring 14 is around 10 to 15% at the periphery of the substrate 10, but around 15 to 20% at the center of the substrate 10. Compared to the high-temperature storage resistance increase rate (20–30%) for the wiring 84 of the comparative example, the high-temperature storage resistance increase rate is suppressed for the wiring 14. It should be noted that the high-temperature storage resistance increase rate is higher at the center of the substrate 10 than at the periphery, and that the holes produced by corrosion of the conductive layer in the wiring are larger at the center of the substrate 10 than at the periphery. This is because the water is supplied during the second spinning process that uses a second substrate rotation speed in the high rotation region. In more detail, the centrifugal forces that are generated during the second spinning process act so that water flows at high speed at the periphery of the substrate 10. This promotes the replacement of cleaning solution by water around the bottoms of the via holes 17 formed in the periphery of the substrate 10. On the other hand, it is difficult for water to reach the center of the substrate 10, so that the replacement of cleaning solution by water around the bottoms of the via holes 17 formed in the center of the substrate 10 is slowed, thereby reducing the speed at which the cleaning solution is dispersed.

As described above, in this first embodiment, in the water rinsing process that follows the cleaning of the via holes 17 formed above the wiring 14 on the substrate 10 using a cleaning solution, a first spinning process, in which water is supplied to the surface of the substrate 10 while the substrate 10 is rotated at a first substrate rotation speed in a low rotation region, and a second spinning process, in which the substrate 10 is rotated at a second substrate rotation speed in a high rotation region, are repeatedly performed alternately. Due to the dispelling of the cleaning solution (including cleaning solution that has been diluted with water) that is caused by the centrifugal forces produced in the second spinning process, there is an improvement in the efficiency with which the cleaning solution is replaced with water in the via holes 17, especially near the bottoms of the via holes 17. Consequently, less time is required by the water rinsing process, and the corrosion of the wiring 14 (and especially the aluminum alloy film 12) by cleaning solution that has been diluted with water can be suppressed. As a result, the reliability of electronic devices can be improved.

Also, according to this first embodiment, water is continuously supplied to the surface of the substrate 10 during the first spinning process and second spinning process, so that the water rinsing process is simple to perform.

In the first spinning process of this first embodiment, water is supplied to the surface of the substrate 10 while the substrate 10 is being rotated at the first substrate rotation speed in a low rotation region, specifically between 10 and 200 rpm, so that water can be evenly supplied to the surface of the substrate 10 in this first spinning process. As a result, the surface of the substrate 10 can be evenly rinsed with water.

In the second spinning process of this first embodiment, the substrate 10 is rotated at the second substrate rotation speed in a high rotation region, specifically between 400 and 2000 rpm, resulting in the pronounced dispelling effect for the cleaning solution (including cleaning solution that has been diluted with water). This makes a definite improvement in the efficiency with which the cleaning solution is replaced with water near the bottoms of the via holes 17.

In this first embodiment, the acceleration that is performed for the substrate rotation speed from the first substrate rotation speed to the second substrate rotation speed, and the deceleration that is performed for the substrate rotation speed from the second substrate rotation speed to the first substrate rotation speed are set in a range of 100 to 400 rpm per second. As a result, the substrate rotation speed can be changed while reducing the load of the spin cleaner.

Second Embodiment

Hereinafter, a method for producing an electronic device according to a second embodiment of the present invention will be described with reference to the accompanying drawings.

Figure 2A:
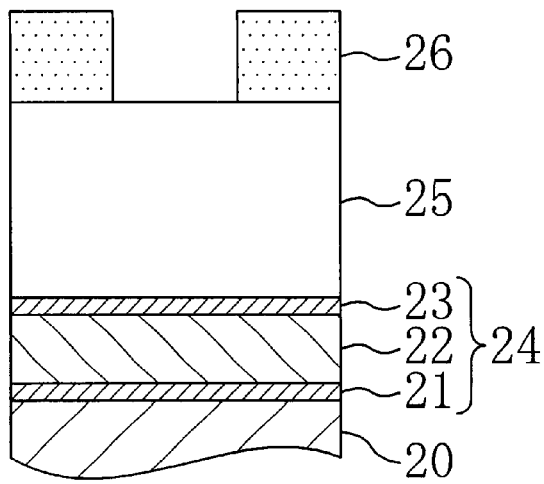
FIGS. 2A to 2C are cross-sectional diagrams showing the processes in a method for producing an electronic device according to a second embodiment of the present invention.
Figure 2B:
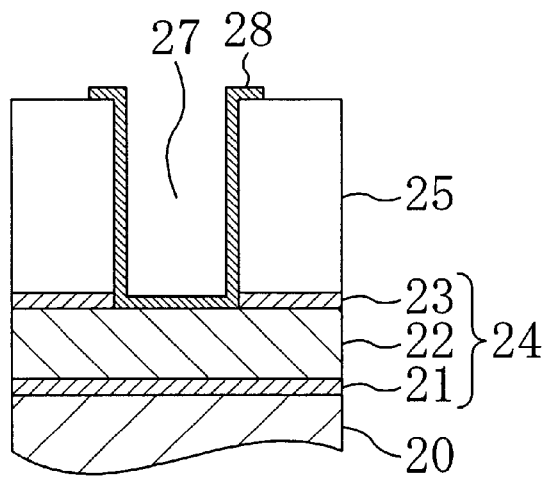
Figure 2C:
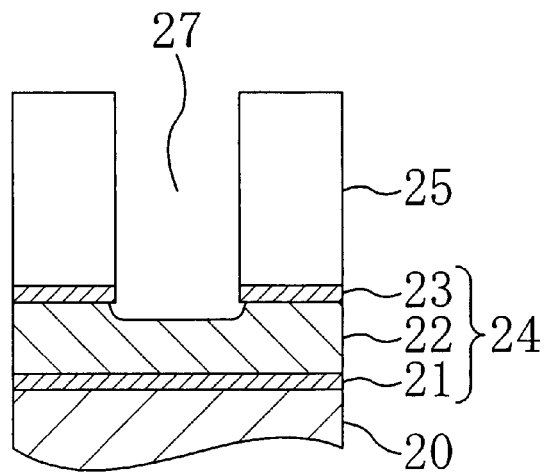

FIGS. 2A to 2C are cross-sectional drawings showing the various processes in the method for producing an electronic device according to this second embodiment.

First, as shown in FIG. 2A, wiring 24 that is composed of a laminated structure of a first titanium nitride film 21, an aluminum alloy film 22, and a second titanium nitride film 23 is formed on a substrate 20 composed of a semiconductor wafer. After this, an insulating film 25 is formed on top of the substrate 20, including the parts where the wiring 24 has been formed. Next, a resist film is formed on the insulating film 25, and the resist film is exposed to light in a desired pattern using a conventional projection method. By developing the resist film that have been exposed using a conventional developing process, a resist pattern 26 is formed with openings at areas where via holes are to be formed.

Next, dry etching is successively performed for the insulating film 25 and the second titanium nitride film 23 with the resist pattern 26 as a mask. As shown in FIG. 2B, once via holes 27 have been formed, plasma ashing is performed to remove the resist pattern 26. When doing so, residue 28 ends up on the side walls and in the bottom of the via holes 27.

As shown in FIG. 2C, a batch-processing-type spin cleaner (not shown) is used to remove the residue 28 by supplying, to the surface of the substrate 20 in which the via holes 27 have been formed, a cleaning solution capable of etching the insulating film 25. One example of the cleaning solution that can be used is a fluorine-containing cleaning solution that has the properties shown in FIG. 8 (see the "Summary of the Invention" section of this specification). By using a fluorine-containing cleaning solution, there is no risk of the insulating film 25 being excessively etched, which would result in the via holes 27 being badly deformed.

After this, the via holes 27 are rinsed with water using the same spin cleaner. In more detail, during the water rinsing of the via holes 27, a first spinning process and a second spinning process are repeatedly performed alternately. In the first spinning process, the substrate 20 is rotated at a constant speed (called the "first substrate rotation speed") that is within a low rotation region (for example, between 10 and 200 rpm) while water is supplied to the surface of the substrate 20 for between 3 and 30 seconds, for example. In the second spinning process, the substrate 20 is rotated at a constant speed (called the "second substrate rotation speed") that is within a high rotation region (for example, between 400 and 2000 rpm) for between 3 and 30 seconds, for example, but water is not supplied. After this, the substrate 20 is dried.

It should be noted that in this second embodiment, the acceleration that is performed for the substrate rotation speed from the first substrate rotation speed to the second substrate rotation speed, and the deceleration that is performed for the substrate rotation speed from the second substrate rotation speed to the first substrate rotation speed are set in a range of 100 to 400 rpm per second.

Also, in this second embodiment, while the substrate rotation speed is changing between the first and second spinning processes, water is not supplied to the surface of the substrate 20.

When the inventors of the present invention investigated the cross-sectional form of the via holes 27 following the water rinsing, corrosion of the aluminum alloy film 22 forming the wiring 24 at the bottoms of the via holes 27 was suppressed, as can be understood by comparing FIG. 2C with the comparative example (see FIG. 9C). Also, only small holes were identified under a portion of the insulating film 25 near the via holes 27. The corrosion of the aluminum alloy film 22 was found to be suppressed evenly for the center and the periphery of the substrate 20. In other words, when compared to the comparative example, the efficiency with which cleaning solution is replaced with water near the bottoms of the via holes 27 is improved evenly across the surface of the substrate 20.

In order to evaluate the reliability of the wiring 24 of an electronic device that has been produced using the method shown in FIGS. 2A to 2C, the inventors of the present invention performed high-temperature storage tests on the wiring 24 using a temperature of 200° C. and a period of 1,000 hours. The high-temperature storage resistance increase rate for the wiring 24 is around 10 to 15% across the surface of the substrate 20. Compared to the high-temperature storage resistance increase rate (20–30%) for the wiring 84 of the comparative example, the high-temperature storage resistance increase rate is suppressed for the wiring 24 evenly across the surface of the substrate 20.

As described above, in this second embodiment, in the water rinsing process that follows the cleaning of the via holes 27 formed above the wiring 24 on the substrate 20 using a cleaning solution, a first spinning process, in which water is supplied to the surface of the substrate 20 while the substrate 20 is rotated at a first substrate rotation speed in a low rotation region, and a second spinning process, in which the substrate 20 is rotated at a second substrate rotation speed in a high rotation region, are repeatedly performed alternately. Due to the dispelling of the cleaning solution (including cleaning solution that has been diluted with water) that is caused by the centrifugal forces produced in the second spinning process, there is an improvement in the efficiency with which the cleaning solution is replaced with water in the via holes 27, especially near the bottoms of the via holes 27. Consequently, less time is required by the water rinsing process. Therefore, corrosion of the wiring 24 (specifically, the aluminum alloy film 22) due to cleaning solution that has been diluted with water can be suppressed, which improves the reliability of an electronic device produced in this way.

In this second embodiment, water is not supplied to the surface of the substrate 20 during the second spinning process in which the substrate 20 is rotated at a second substrate rotation speed in the high rotation region. Compared to a case where water is supplied to the surface of the substrate 20 during the second spinning process, there is an improvement in the efficiency with which water is replaced with cleaning solution near the bottoms of the via holes 27, so that even less time is required by the water rinsing process. Also, during the second spinning process, centrifugal forces do not result in water flowing at high speed across the periphery of the substrate 20, which suppresses any deviation in the efficiency with which the cleaning solution is replaced with water near the bottoms of the via holes 27 between the center of the substrate 20 and the periphery of the substrate 20, and so means that the surface of the substrate 20 can be evenly rinsed with water. As a result, the corrosion of the wiring 24 is suppressed evenly across the surface of the substrate, so that wiring 24 that has favorable characteristics (specifically, a high-temperature storage resistance increase rate of around 10 to 15%) can be formed across the entire surface of the substrate 20.

In the first spinning process of this second embodiment, water is supplied to the surface of the substrate 20 while the substrate 20 is being rotated at the first substrate rotation speed in a low rotation region, specifically between 10 and 200 rpm, so that water can be evenly supplied to the surface of the substrate 20 in this first spinning process. This means that the surface of the substrate 20 can be evenly rinsed with water.

In the second spinning process of this second embodiment, the substrate 20 is rotated at the second substrate rotation speed in a high rotation region, specifically between 400 and 2000 rpm, resulting in a pronounced dispelling effect for the cleaning solution (including cleaning solution that has been diluted with water) in the second spinning process. This makes a definite improvement in the efficiency with which the cleaning solution is replaced with water near the bottoms of the via holes 27.

In this second embodiment, the acceleration that is performed for the substrate rotation speed from the first substrate rotation speed to the second substrate rotation speed, and the deceleration that is performed for the substrate rotation speed from the second substrate rotation speed to the first substrate rotation speed are set in a range of 100 to 400 rpm per second. As a result, the substrate rotation speed can be changed while reducing the load of the spin cleaner.

Third Embodiment

Hereinafter, a method for producing an electronic device according to a third embodiment of the present invention will be described with reference to the accompanying drawings.

Figure 3A:
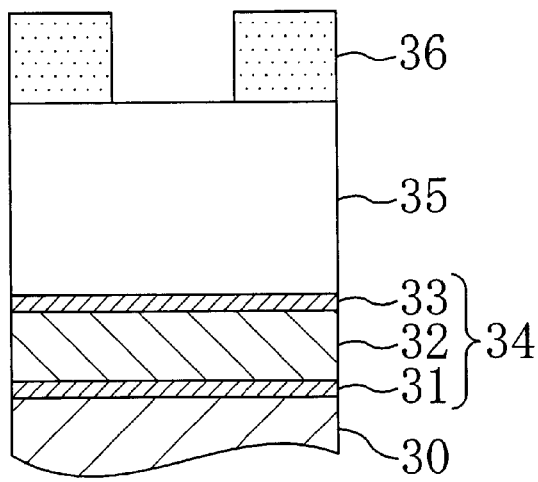
FIGS. 3A to 3C are cross-sectional diagrams showing the processes in a method for producing an electronic device according to a third embodiment of the present invention.
Figure 3B:
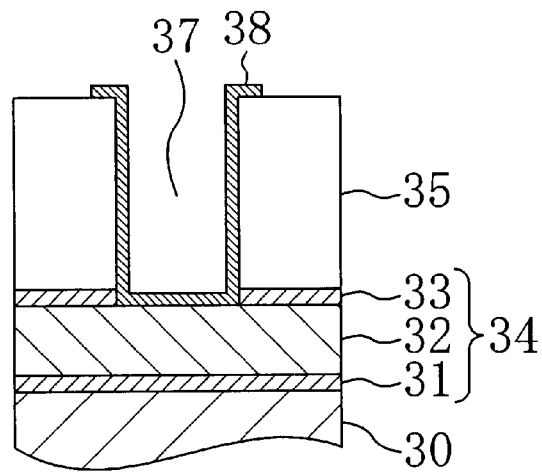
Figure 3C:
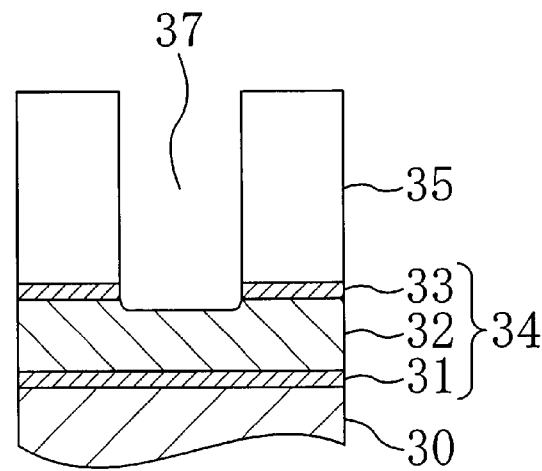

FIGS. 3A to 3C are cross-sectional drawings showing the various processes in the method for producing an electronic device according to this third embodiment.

First, as shown in FIG. 3A, wiring 34 that is composed of a laminated structure of a first titanium nitride film 31, an aluminum alloy film 32, and a second titanium nitride film 33 is formed on a substrate 30 composed of a semiconductor wafer. After this, an insulating film 35 is formed on top of the substrate 30, including the parts where the wiring 34 has been formed. Next, a resist film is formed on the insulating film 35, and the resist film is exposed to light in a desired pattern using a conventional projection method. By developing the resist film that have been exposed using a conventional developing process, a resist pattern 36 is formed with openings at areas where via holes are to be formed.

Next, dry etching is successively performed for the insulating film 35 and the second titanium nitride film 33 with the resist pattern 36 as a mask. As shown in FIG. 3B, once via holes 37 have been formed, plasma ashing is performed to remove the resist pattern 36. When doing so, residue 38 ends up on the side walls and in the bottom of the via holes 37.

As shown in FIG. 3C, a batch-processing-type spin cleaner (not shown) is used to remove the residue 38 by supplying a cleaning solution capable of etching the insulating film 35 to the surface of the substrate 30 in which the via holes 37 have been formed. One example of the cleaning solution that can be used is a fluorine-containing cleaning solution that has the properties shown in FIG. 8 (see the "Summary of the Invention" section of this specification). By using a fluorine-containing cleaning solution, there is no risk of the insulating film 35 being excessively etched, which would result in the via holes 37 being badly deformed.

After this, the via holes 37 are rinsed with water using the same spin cleaner. In more detail, during the water rinsing of the via holes 37, a first spinning process and a second spinning process are repeatedly performed alternately. In the first spinning process, the substrate 30 is rotated at a constant speed (called the "first substrate rotation speed") that is within a low rotation region (for example, between 10 and 200 rpm) while water is supplied to the surface of the substrate 30 for between 3 and 30 seconds, for example. In the second spinning process, the substrate 30 is rotated at a constant speed (called the "second substrate rotation speed") that is within a high rotation region (for example, between 400 and 2000 rpm) for between 3 and 30 seconds, for example, but water is not supplied. After this, the substrate 30 is dried.

It should be noted that in this third embodiment, the acceleration that is performed for the substrate rotation speed from the first substrate rotation speed to the second substrate rotation speed, and the deceleration that is performed for the substrate rotation speed from the second substrate rotation speed to the first substrate rotation speed are set in a range of 600 to 1000 rpm per second.

Also, in this third embodiment, while the substrate rotation speed is changing between the first and second spinning processes, water is not supplied to the surface of the substrate 30.

When the inventors of the present invention investigated the cross-sectional form of the via holes 37 following the water rinsing, corrosion of the aluminum alloy film 32 forming the wiring 34 at the bottoms of the via holes 37 was suppressed, as can be understood by comparing FIG. 3C with the comparative example (see FIG. 9C). Also, it was recognized that few holes were formed under a portion of the insulating film 35 near the via holes 37. The corrosion of the aluminum alloy film 32 was found to be suppressed evenly for the center and the periphery of the substrate 30. In other words, when compared to the comparative example, the efficiency with which cleaning solution is replaced with water near the bottoms of the via holes 37 is improved evenly across the surface of the substrate 30.

In order to evaluate the reliability of the wiring 34 of an electronic device that has been produced using the method shown in FIGS. 3A to 3C, the inventors of the present invention performed high-temperature storage tests on the wiring 34 using a temperature of 200° C. and a period of 1,000 hours. The high-temperature storage resistance increase rate for the wiring 34 is around 5 to 10% across the surface of the substrate 30. Compared to the high-temperature storage resistance increase rate (20–30%) for the wiring 84 of the comparative example, the high-temperature storage resistance increase rate is suppressed for the wiring 34 evenly across the surface of the substrate 30.

As described above, in this third embodiment, in the water rinsing process that follows the cleaning of the via holes 37 formed above the wiring 34 on the substrate 30 using a cleaning solution, a first spinning process, in which water is supplied to the surface of the substrate 30 while the substrate 30 is rotated at a first substrate rotation speed in a low rotation region, and a second spinning process, in which the substrate 30 is rotated at a second substrate rotation speed in a high rotation region, are repeatedly performed alternately. Due to the dispelling of the cleaning solution (including cleaning solution that has been diluted with water) that is caused by the centrifugal forces produced in the second spinning process, there is an improvement in the efficiency with which the cleaning solution is replaced with water in the via holes 37, especially near the bottoms of the via holes 37. Consequently, less time is required by the water rinsing process. Therefore, corrosion of the wiring 34 (specifically, the aluminum alloy film 32) due to cleaning solution that has been diluted with water can be suppressed, which improves the reliability of an electronic device produced in this way.

In this third embodiment, water is not supplied to the surface of the substrate 30 during the second spinning process in which the substrate 30 is rotated at a second substrate rotation speed in the high rotation region. Compared to a case where water is supplied to the surface of the substrate 30 during the second spinning process, there is an improvement in the efficiency with which water is replaced with cleaning solution near the bottoms of the via holes 37, so that even less time is required by the water rinsing process. Also, during the second spinning process, centrifugal forces do not result in water flowing at high speed across the periphery of the substrate 30, which suppresses any deviation in the efficiency with which the cleaning solution is replaced with water near the bottoms of the via holes 37 between the center of the substrate 30 and the periphery of the substrate 30. This means that the surface of the substrate 30 can be evenly rinsed with water. As a result, the corrosion of the wiring 34 is suppressed evenly across the surface of the substrate 30, so that the wiring 34 can be formed with favorable characteristics across the entire surface of the substrate 30.

In the first spinning process of this third embodiment, water is supplied to the surface of the substrate 30 while the substrate 30 is being rotated at the first substrate rotation speed that is in a low rotation region, specifically between 10 and 200 rpm, so that water can be evenly supplied to the surface of the substrate 30 in this first spinning process. This means that the surface of the substrate 30 can be evenly rinsed with water.

In the second spinning process of this third embodiment, the substrate 30 is rotated at the second substrate rotation speed that is in a high rotation region, specifically between 400 and 2000 rpm, resulting in the pronounced dispelling effect for the cleaning solution (including cleaning solution that has been diluted with water) in the second spinning process. This makes a definite improvement in the efficiency with which the cleaning solution is replaced with water near the bottoms of the via holes 37.

In this third embodiment, the acceleration that is performed for the substrate rotation speed from the first substrate rotation speed to the second substrate rotation speed, and the deceleration that is performed for the substrate rotation speed from the second substrate rotation speed to the first substrate rotation speed are set in a range of 600 to 1000 rpm per second. As a result, high acceleration and deceleration are performed between the first and second spinning processes, so that there is a further increase in inertia that increases the dispelling of the cleaning solution (including cleaning solution that has been diluted with water), thereby making a further improvement in the efficiency with which the cleaning solution is replaced with water near the bottoms of the via holes 37. This reliably suppresses the corrosion of the wiring 34 by cleaning solution that has been diluted with water, and enables the wiring 34 to be formed with superior characteristics (specifically, a high-temperature storage resistance increase rate of around 5 to 10%). As a result, electronic devices can be made even more reliable.

Table 1 shows the characteristics of the methods for producing electronic devices according to the first to third embodiments. In more detail, Table 1 shows whether water is supplied during the first spinning process which uses a first substrate rotation speed in a low rotation region and the second spinning process which uses a second substrate rotation speed in a high rotation region, and the acceleration used when changing from the first substrate rotation speed (the low rotation region) to the second substrate rotation speed (the high rotation region), or conversely the deceleration used when reducing the substrate rotation speed from the second substrate rotation speed to the first substrate rotation speed.

TABLE 1

| | Supply of water | | Acceleration from the low rotation region to the high rotation region and deceleration from the high rotation region to the low rotation region |
|---|---|---|---|
| | Low rotation region | High rotation region | |
| First embodiment | yes | yes | 100 to 400 rpm/second |
| Second embodiment | yes | no | 100 to 400 rpm/second |
| Third embodiment | yes | no | 600 to 1000 rpm/second |

Figure 4:
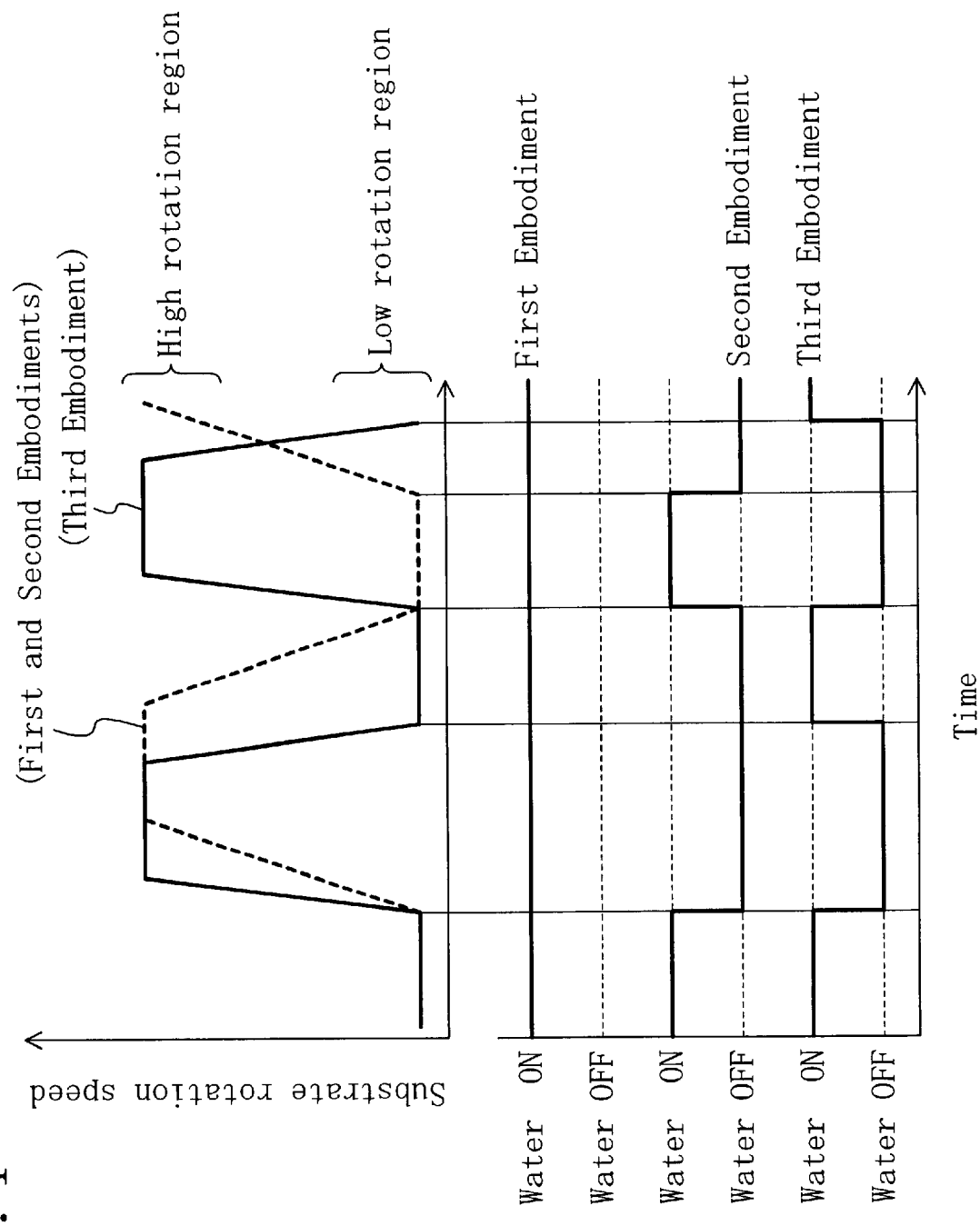
FIG. 4 is a graph showing changes in substrate rotation speed over time and periods where water is supplied for each of the methods for producing electronic devices according to the first to third embodiments of the present invention.

FIG. 4 shows the changes over time in the substrate rotation speed and the periods during which water is supplied for each of the methods for producing electronic devices according to the first to third embodiments. In FIG. 4, the expression "water ON" indicates that water is being supplied while the expression "water OFF" indicates that water is not being supplied.

Figure 5:
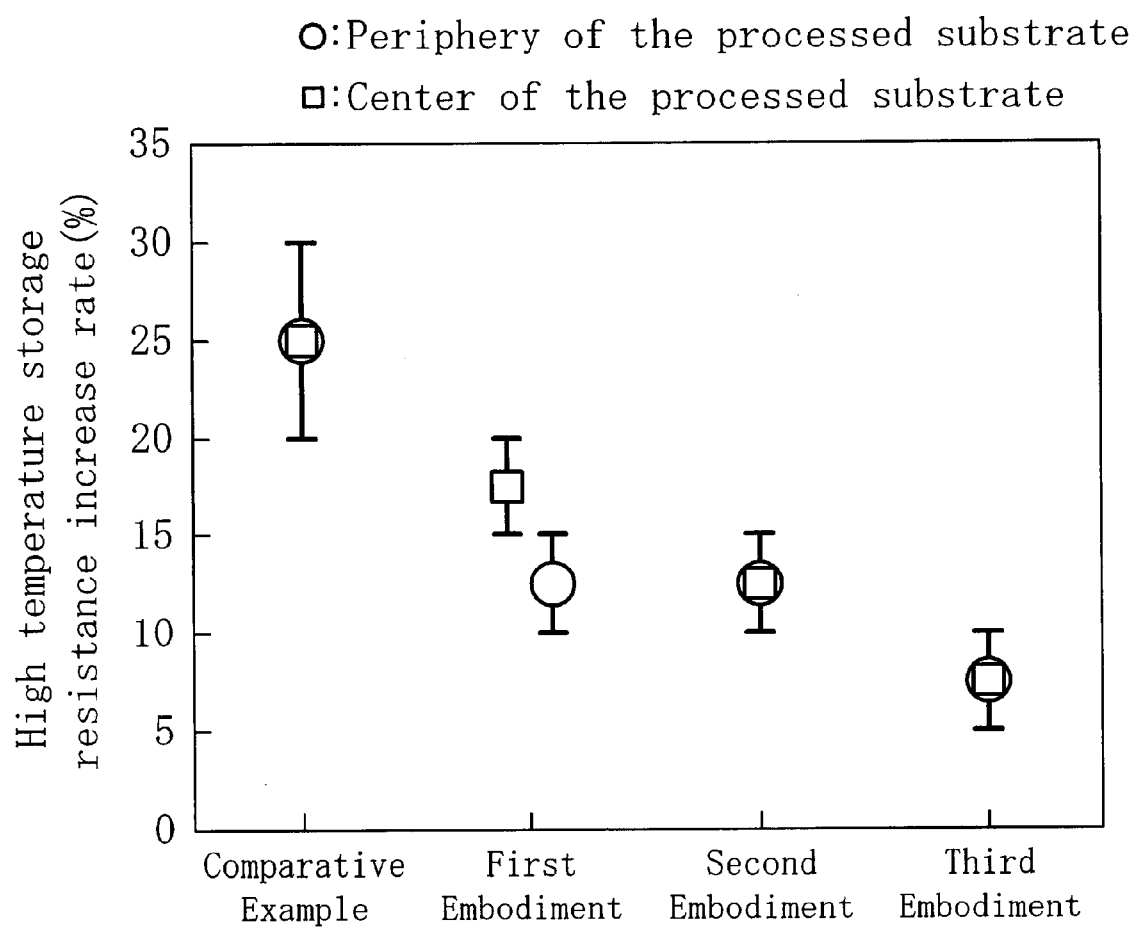
FIG. 5 is a graph showing high-temperature storage resistance increase rates for wiring in a center and a periphery of a processed substrate, the wiring having been respectively formed using a comparative example of a method for producing an electronic device and the methods for producing electronic devices according to the first to third embodiments of the present invention.
Figure 6:
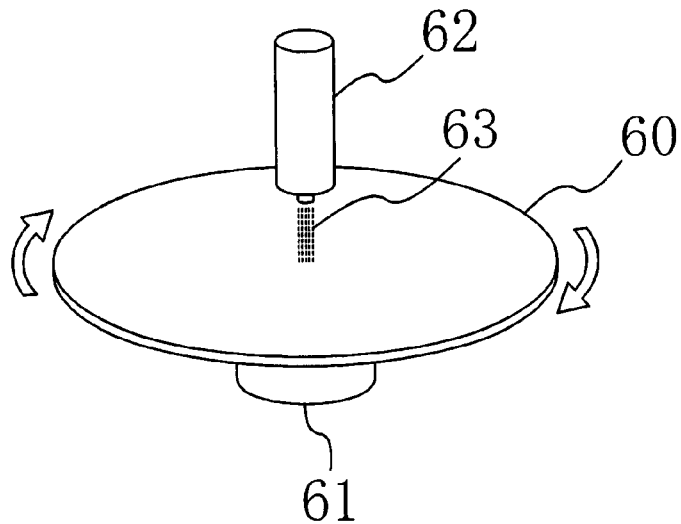
FIG. 6 shows how the surface of a processed substrate composed of a semiconductor wafer is rinsed with water using a single-wafer-processing-type spin cleaner.
Figure 7:
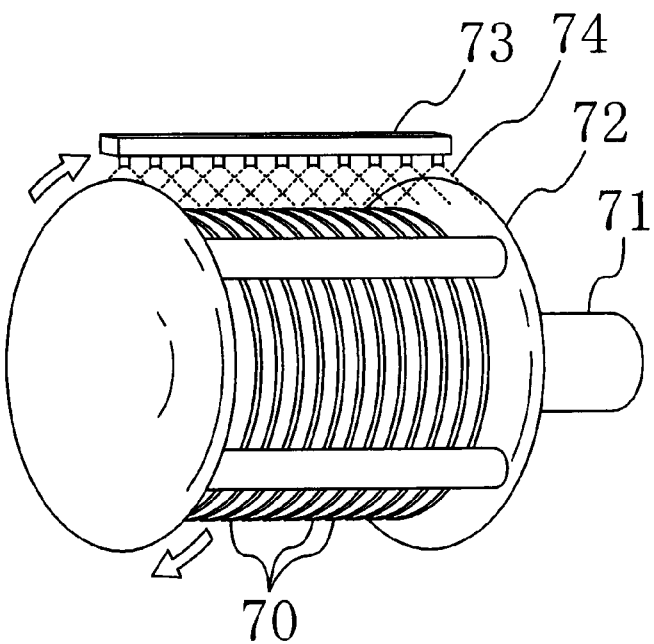
FIG. 7 shows how the surfaces of processed substrates composed of semiconductor wafers are rinsed with water using a batch-processing-type spin cleaner.

FIG. 5 is a graph showing the high-temperature storage resistance increase rate for wiring that is formed at the periphery and the center of a processed substrate for a method for producing electronic devices that is given as a comparative example, and for each of the methods for producing electronic devices according to the first to third embodiments.

Table 2 shows the ability to suppress the high-temperature storage resistance increase rate and the sizes of holes produced due to the corrosion of the conductive layer in the wiring, for the method for producing electronic devices given as a comparative example and for each of the methods for producing electronic devices according to the first to third embodiments. Here, the smaller the sizes of the holes produced, the more favorable the result.

TABLE 2

| | Suppression of the high-temperature storage resistance increase rate | Sizes of holes produced due to the corrosion of the conductive layer |
|---|---|---|
| Comparative example | X | large |
| First embodiment | substrate center: Δ substrate periphery: ○ | substrate center: medium substrate periphery: small |
| Second embodiment | ○ | small |
| Third embodiment | ⊚ | extremely small | where "⊚" means "very good", "○" means "good", "Δ" means "fairly good", and "X" means "poor".

It should be noted that while the first to third embodiments are described as using a batch-processing-type spin cleaner, a single-wafer-processing-type spin cleaner may be used instead. When a single-wafer-processing-type spin cleaner is used, a range of 400 to 4000 rpm can be used as the high rotation region in which the second substrate rotation speed may be set.

Figure 8:
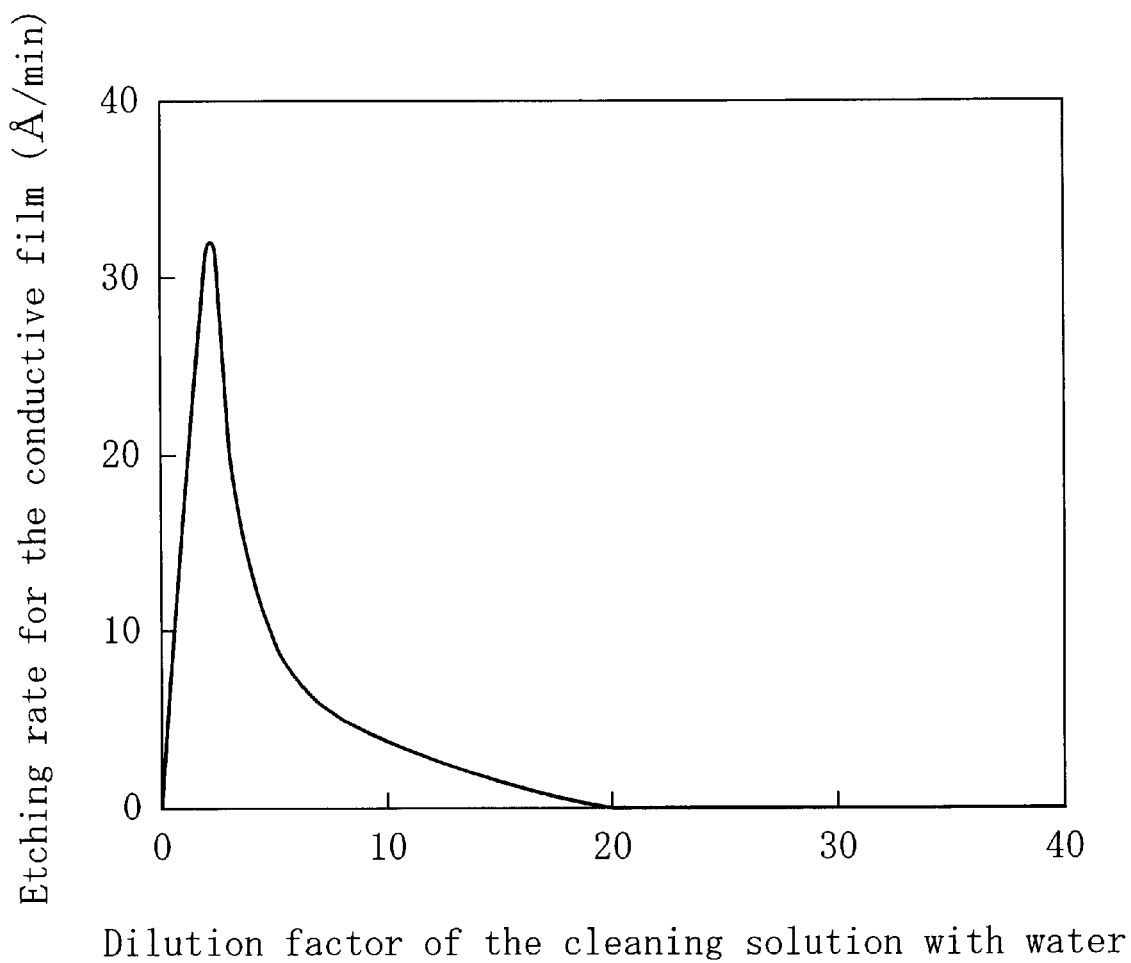
FIG. 8 shows one example of a relationship between the dilution factor of a cleaning solution with water and an etching rate at which a conductive film is etched by the cleaning solution.

Also, in the first to third embodiments, a fluorine-containing cleaning solution that has the properties shown in FIG. 8 is used as the cleaning solution, though there are no particular restrictions regarding the cleaning solution that is used.

In the first to third embodiments, the water used in the water rinsing process can be at normal room temperature, which is to say, at around 18 to 25° C. for example. When the efficiency with which the cleaning solution is replaced with water in the water rinsing process is poor, such as when a highly viscous cleaning solution is used in the cleaning process that precedes the water rinsing process, water that has been heated to 35 to 60° C., for example, may be used.

Also, in the first to third embodiments, details, such as the temperature of the water used in the water rinsing process, the periods for which the first spinning process and second spinning process are performed, and the total time taken by the water rinsing process in which the first and second spinning processes are alternately repeated, is preferably determined at suitable values for the type of cleaning solution used in the cleaning process that precedes the water rinsing process or the construction and/or materials of the wiring formed on the substrate.

In the first to third embodiments, various methods may be used to supply the water to the processed substrate. As examples, water may be sprayed in a shower, sprayed as a jet, or continuously or intermittently dripped onto the processed substrate as the substrate rotates.

Finally, in the first to third embodiments, after the via holes are formed by performing dry-etching for the insulating film formed on the wiring, residue present on the side walls and at the bottom of the via holes is removed using a cleaning solution, before the via holes are rinsed using water. However, this is not a restriction for the present invention. As one example, dry-etching can be performed for an insulating film formed on a MOS transistor to form contact holes, before residue present on the side walls and at the bottom of the contact holes is removed using a cleaning solution and the contact holes are rinsed using water. Also, after dry etching is performed on a conducting film formed on an insulating film to form a wiring pattern, residue present on the side walls of the wiring pattern can be removed using a cleaning solution, before the writing pattern is rinsed using water. When grooves for the wiring are formed in the insulating film by a Dual Damascene process, residue present on the side walls and at the bottom of the grooves for the wiring may be removed using a cleaning solution and the grooves for the wiring can then be rinsed using water.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A substrate cleaning method, comprising steps of
   cleaning a surface of a processed substrate using a cleaning solution,
   rinsing the surface of the processed substrate with water after the processed substrate has been cleaned, and
   drying the rinsed processed substrate,
   wherein the step of rinsing the surface of the processed substrate includes a step of having a first spinning process, where the processed substrate is rotated at a first rotation speed and water is simultaneously supplied to the surface of the processed substrate, and a second spinning process, where the processed substrate is rotated at a second rotation speed that is higher than the first rotation speed and water is simultaneously supplied to the surface of the processed substrate, repeatedly performed alternately by a same spin cleaner, and wherein the step of drying the rinsed processed substrate is performed after the step of repeatedly and alternately performing the first spinning process and the second spinning process.

2. A substrate cleaning method according to claim 1, wherein the spin cleaner is one of a batch-processing-type spin cleaner and a single-wafer-processing-type spin cleaner.

3. A substrate cleaning method according to claim 1, wherein the first rotation speed is between 10 and 200 rpm.

4. A substrate cleaning method according to claim 1, wherein the second rotation speed is between 400 and 2000 rpm.

5. A substrate cleaning method according to claim 1, wherein an acceleration at which a rotation speed of the processed substrate increases from the first rotation speed to the second rotation speed and a deceleration at which the rotation speed of the processed substrate decreases from the second rotation speed to the first rotation speed are between 100 and 400 rpm per second.

6. A substrate cleaning method, comprising steps of cleaning a surface of a processed substrate using a cleaning solution, rinsing the surface of the processed substrate with water after the processed substrate has been cleaned, and drying the rinsed processed substrate, wherein the step of rinsing the surface of the processed substrate includes a step of having a first spinning process, where the processed substrate is rotated at a first rotation speed and water is simultaneously supplied to the surface of the processed substrate, and a second spinning process, where the processed substrate is rotated at a second rotation speed that is higher than the first rotation speed without water being supplied to the surface of the processed substrate, repeatedly performed alternately by a same spin cleaner and wherein the step of drying the rinsed processed substrate is performed after the step of repeatedly and alternately performing the first spinning process and the second spinning process.

7. A substrate cleaning method according to claim 6, wherein the spin cleaner is one of a batch-processing-type spin cleaner and a single-wafer-processing-type spin cleaner.

8. A substrate cleaning method according to claim 6, wherein the first rotation speed is between 10 and 200 rpm.

9. A substrate cleaning method according to claim 6, wherein the second rotation speed is between 400 and 2000 rpm.

10. A substrate cleaning method according to claim 6, wherein an acceleration at which a rotation speed of the processed substrate increases from the first rotation speed to the second rotation speed and a deceleration at which the rotation speed of the processed substrate decreases from the second rotation speed to the first rotation speed are between 100 and 400 rpm per second.

11. A substrate cleaning method according to claim 6, wherein an acceleration at which a rotation speed of the processed substrate increases from the first rotation speed to the second rotation speed and a deceleration at which the rotation speed of the processed substrate decreases from the second rotation speed to the first rotation speed are between 600 and 1000 rpm per second.

12. An electronic device that is produced using the substrate cleaning method according to claim 1.

13. An electronic device that is produced using the substrate cleaning method according to claim 6.

14. A substrate cleaning method according to claim 1, wherein the first spinning process includes a step of replacing the cleaning solution on the surface of the processed substrate with water by spinning the processed substrate at the first rotation speed in low rotation region, and wherein the second spinning process includes a step of dispelling the cleaning solution and/or the cleaning solution that has been diluted with water, from the processed substrate by spinning the processed substrate at the second rotation speed in high rotation region.

15. A substrate cleaning method according to claim 6, wherein the first spinning process includes a step of replacing the cleaning solution on the surface of the processed substrate with water by spinning the processed substrate at the first rotation speed in low rotation region, and wherein the second spinning process includes a step of dispelling the cleaning solution and/or the cleaning solution that has been diluted with water, from the processed substrate by spinning the processed substrate at the second rotation speed in high rotation region.

* * * * *

UNITED STATES PATENT AND TRADEMARK OFFICE
CERTIFICATE OF CORRECTION

PATENT NO.    : 6,642,142 B2
DATED         : November 4, 2003
INVENTOR(S)   : Toshihiko Nagai et al.

It is certified that error appears in the above-identified patent and that said Letters Patent is hereby corrected as shown below:

<u>Title page,</u>
Item [73], Assignee, insert the following as the second assignee:
-- Mitsubishi Denki Kabushiki Kaisha, (JP) --

Signed and Sealed this

First Day of June, 2004

JON W. DUDAS
*Acting Director of the United States Patent and Trademark Office*